(12) United States Patent
Bringivijayaraghavan (10) Patent No.: US 10,020,809 B2
(45) Date of Patent: Jul. 10, 2018

(54) INTEGRATED LEVEL TRANSLATOR AND LATCH FOR FENCE ARCHITECTURE

(71) Applicant: GLOBALFOUNDRIES INC., Grand Cayman (KY)

(72) Inventor: Venkatraghavan Bringivijayaraghavan, Cheyyar (IN)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/269,139

(22) Filed: Sep. 19, 2016

(65) Prior Publication Data

US 2018/0083629 A1 Mar. 22, 2018

(51) Int. Cl.
*H03K 19/018* (2006.01)
*H03K 19/0185* (2006.01)
*H03K 3/356* (2006.01)
*G11C 11/418* (2006.01)

(52) U.S. Cl.
CPC .... *H03K 19/018507* (2013.01); *G11C 11/418* (2013.01); *H03K 3/356* (2013.01)

(58) Field of Classification Search
CPC ... H03K 19/018507; H03K 19/018521; H03K 19/01855; H03K 3/356; G11C 11/418
See application file for complete search history.

(56) References Cited

U.S. PATENT DOCUMENTS

| 7,071,758 | B2* | 7/2006 | Tseng | H03K 19/01855 326/121 |
| 7,397,278 | B2* | 7/2008 | Nakao | G09G 3/3685 326/68 |
| 7,443,223 | B2* | 10/2008 | Bajkowski | H03K 19/01855 326/68 |
| 7,525,367 | B2 | 4/2009 | Behrends et al. | |
| 8,559,247 | B2* | 10/2013 | Shiu | G11C 7/1057 326/68 |
| 8,599,642 | B2* | 12/2013 | Bunce | G11C 11/419 365/233.12 |
| 8,811,109 | B2* | 8/2014 | Terzioglu | G11C 8/10 365/189.06 |
| 9,202,555 | B2* | 12/2015 | Jung | G11C 11/418 |
| 9,240,789 | B2* | 1/2016 | Friedman | H03K 19/018521 |
| 9,299,395 | B2* | 3/2016 | Kulkarni | G11O 5/145 |

(Continued)

OTHER PUBLICATIONS

Tran C Q et. al., "Low Power High Speed Level Shifter Design for Block Level Dynamic Voltage Scaling Environment", IEEE International Conference on Integrated Circuit Design and Technology, 2005, DOI: 10.1109/ICICDT.2005.1502637, 4 pages.

(Continued)

*Primary Examiner* — Thomas J Hiltunen
(74) *Attorney, Agent, or Firm* — Anthony Canale; Andrew M. Calderon; Roberts Mlotkowski Safran Cole & Calderon, P.C.

(57) ABSTRACT

The present disclosure relates to integrated level translator and latch circuits and, more particularly, to an integrated level translator and latch circuits for fence architectures in SRAM cells. The integrated level translator and latch for input signals includes a first clock (CLKS) and a second clock (CLKH). The first clock (CLKS) is used as a precharge and evaluation clock with its timing being critical for forward edge and the second clock (CLKH) is a latch clock.

17 Claims, 4 Drawing Sheets

(56) References Cited

U.S. PATENT DOCUMENTS

| | | | |
|---|---|---|---|
| 2008/0030231 A1* | 2/2008 | Hashimoto | H03K 19/018521 |
| | | | 326/80 |
| 2008/0084231 A1 | 4/2008 | Behrends et al. | |
| 2008/0084237 A1 | 4/2008 | Behrends et al. | |
| 2009/0167355 A1* | 7/2009 | Bosshart | H03K 19/01855 |
| | | | 326/62 |
| 2009/0174457 A1 | 7/2009 | Behrends et al. | |
| 2017/0005660 A1* | 1/2017 | Hong | H03K 17/693 |
| 2017/0063377 A1* | 3/2017 | Hwang | H03K 19/018521 |

OTHER PUBLICATIONS

Taiwanese Office Action in related TW Application No. 105144158 dated Mar. 13, 2018, 4 pages.

\* cited by examiner

INTEGRATED LEVEL TRANSLATOR AND LATCH FOR FENCE ARCHITECTURE

FIELD OF THE INVENTION

The present disclosure relates to integrated level translator and latch circuits and, more particularly, to an integrated level translator and latch circuits for fence architectures in SRAM cells, methods of manufacture and use.

BACKGROUND

Voltage level translator circuits are useful in certain applications, including wireless handsets, notebook computers and personal digital assistants (PDAs) and, more particularly in SRAM cells, which run on two or more different voltage levels. For example, circuitry utilized with such portable applications may be configured so that a portion of the circuitry, such as, for example, input/output (IO) buffers, runs at a higher voltage level, while another portion of the circuitry, e.g., core logic, runs at a lower voltage level. This difference in voltage levels often necessitates the use of a voltage level translator circuit for interfacing between the multiple voltage levels.

Conventional voltage level translator circuits have been found to be unreliable at certain process, voltage and/or temperature (PVT) conditions. In fact, it has been found that conventional level translators and latch circuitry is slow as logic depth is high. Also, the conventional level translator and latch circuitry has high setup time. Moreover, the clock and wordline propagation delay in such conventional configurations can be high. In addition, conventional latches are not well suited for fenced architectures.

SUMMARY

In an aspect of the disclosure, a structure comprises an integrated level translator and latch for input signals comprising a first clock (CLKS) and a second clock (CLKH), the first clock (CLKS) being used as a precharge and evaluation clock with its timing being critical for forward edge and the second clock (CLKH) being a latch clock.

In an aspect of the disclosure, an integrated level translator and latch for input signals comprises: a first clock (CLKS) in VCS domain and which is configured as a precharge and evaluation clock with its timing being critical for forward edge; a second clock (CLKH) derived from the first clock (CLKS); a third clock (CLKHN) which is inverse to the second clock (CLKN), the second clock (CLKN) and the third clock (CLKHN) being latch clocks; and a keeper device comprising a plurality of transistors in series. A first transistor of the keeper device is independently controlled by an input (INP) and a second transistor of the keeper device is controlled by an output (OUTN) of a level translator.

In an aspect of the disclosure, a method comprises: at the initial stage of operation, setting a first clock (CLKHN) and a second clock (CLKS) to low and a third clock (CLKH) to high, wherein the low signals of the first clock (CLKHN) and the second clock (CLKS) result in an input (INP) going low; and holding a keeper device in an ON state so that an output (OUT) will be pre-charged to low, which is fed to the keep device as the input (INP).

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to integrated level translator and latch circuits and, more particularly, to an integrated level translator and latch circuits for fence architectures, methods of manufacture and use. As should be understood by those of skill in the art, fence architecture means all the inputs are latched at the boundary of the SRAM cell. In this way, all setup and hold are referenced with respect to this latch. Other styles of architecture include set up and hold referenced internal to the SRAM cell.

In more specific embodiments, the present disclosure describes integrated level translator and latch circuits for all input signals including wordline (WL) decoder, WL address, decode address and column address. In embodiments, the integrated level translator and latch circuits include two clocks, CLKH and CLKS, with CLKS being used as a pre-charge/evaluation clock in VCS domain, with only the timing of clock CLKS being critical for forward edge.

Advantageously, in embodiments, the integrated level translator and latch circuits have low logical depth and achieves higher performance, e.g., faster access time and enables high frequency operation, than conventional circuits. In addition, the integrated level translator and latch circuits have reduced setup and hold time for the latch, with the hold time being tunable for improved yields. In addition, the circuits described herein provide many additional advantages including, but not limited to:

(i) Pre-charge and evaluate scheme is highly suitable for WL decoders;

(ii) Providing a smaller size than a conventional latch and level translator, hence providing considerable savings of real estate on a semiconductor chip;

(iii) Providing less load on clock due to clock leg sharing;

(iv) Consuming less power (e.g., low power) due to only the selected address decode signal having to be toggled; and (v) Compatible with fenced architectures.

Figure 1:
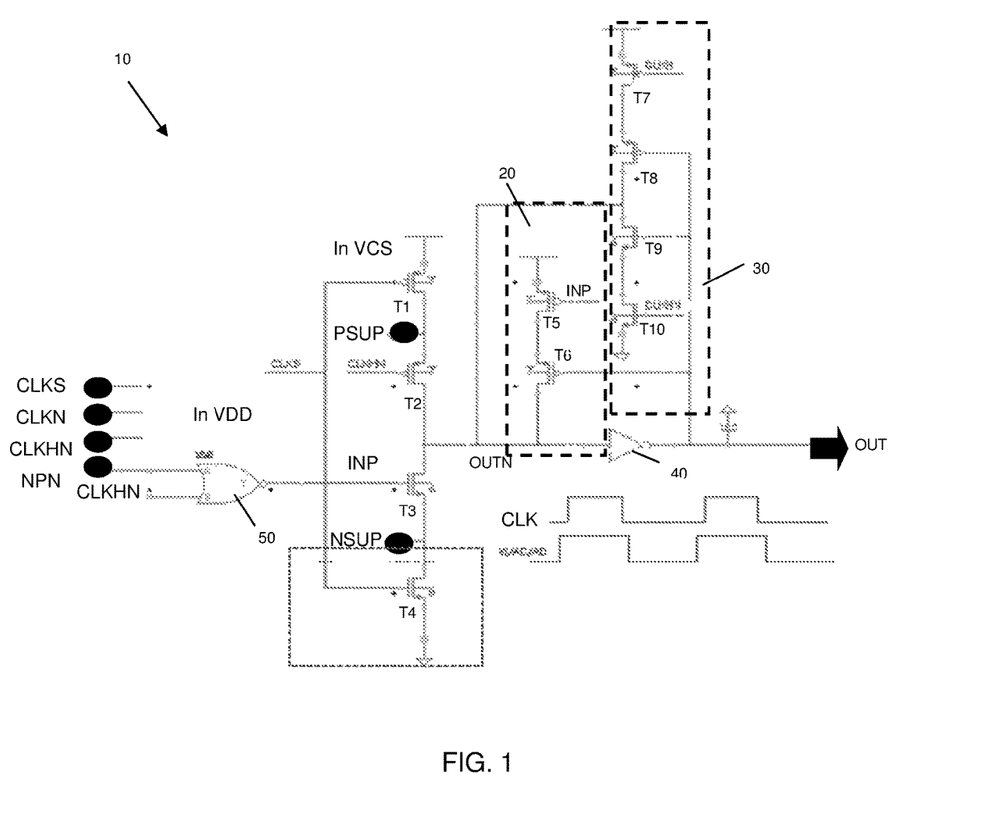
FIG. 1 shows an integrated level translator and latch circuit in accordance with aspects of the present disclosure.

FIG. 1 shows an integrated level translator and latch circuit in accordance with aspects of the present disclosure. In particular, the integrated level translator and latch circuit 10 of FIG. 1 includes two clocks: CLKH and CLKS. In embodiments, CLKH is a hold clock and CLKS is a pre-charge/evaluation clock in the VCS domain, with only the timing of clock CLKS being critical for forward edge. In embodiments, the clock CLKS is an internal, self-timed clock which has a slight delay to the external clock CLK. The input to the integrated level translator and latch circuit 10 is in the VDD domain, whereas, the output is in the VCS domain.

The integrated level translator and latch circuit 10 further includes CLKHN, which is an inverted clock CLKH. For example, when the clock CLKH goes low, the clock CLKHN will go high, or vice versa. In embodiments, the clocks CLKH/CLKHN are the latch clocks which are derived from the clock CLKS (e.g., rising edge pulse stretched clock CLKS is clock CLKHN at approximately six 6 gates pulse stretch delay (see timing diagram of FIG. 2)). Accordingly, the clock CLKH is equal to the CLKS with a rising edge delay but with a falling edge being the same as clock CLKS. (See, e.g., FIG. 2.) In embodiments, in order to reduce loading on the clocks CLKS, CLKH and CLKHN, the boxed legs are shared across four such latches.

Still referring to FIG. 1, the integrated level translator and latch circuit 10 further includes a plurality of transistors T1-T10. In embodiments, transistors T5 and T6 are PMOS transistors arranged in a series configuration and which are configured to be used as a keeper device 20. As should be understood by those of skill in the art, the operation of the PMOS transistor T5 of the keeper device 20 is dependent on the input INP; whereas, the operation of the PMOS transistor T6 of the keeper device 20 operates by the output signal, OUTN.

In embodiments, the transistors T7-T10 are configured to be used as a feedback loop 30. In one implementation, the transistors T7 and T8 are PMOS transistors and the transistors T9 and T10 are NMOS transistors, all of which are arranged in a series configuration. As further shown in FIG. 1, the transistors T1-T2 are PMOS transistors and transistors T3-T4 are NMOS transistors arranged in a series configuration, with their output OUTN leading to one of the keeper device 20, the feedback loop 30 or an inverter 40. Transistor T4 can be shared across four blocks to minimize clock loading.

FIG. 1 further shows the inverter 40 provided at the output, OUTN, of the transistors T1-T4. Moreover, a NOR gate 50 is shown to have an input INPN (VDD) or input of the clock CLKHN. The output of the NOR gate 50 is the input INP. As should be understood by those of skill in the art, the input INPN is part decoded WL address in the VDD domain. In embodiments, 8 WL addresses and 20 latches can be provided for a 256 WL.

Figure 2:
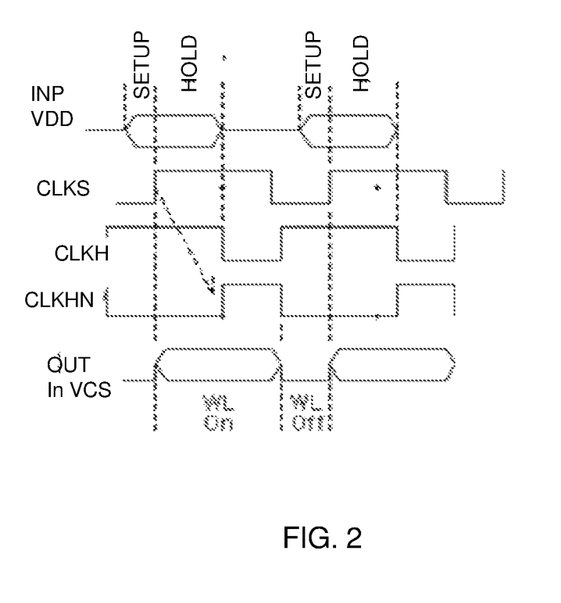
FIG. 2 shows a timing diagram of the integrated level translator and latch circuit of FIG. 1.

FIG. 2 shows a timing diagram of the integrated level translator and latch circuit of FIG. 1. Referring to both the timing diagram of FIG. 2 and the integrated level translator and latch circuit 10 of FIG. 1, the setup time of the integrated level translator and latch circuit 10 is provided in relation to the rising edge of the clock CLKS; whereas, the hold time is provided in relation to the rising edge of the clock CLKHN. For example, when the clock CLKS is low, the output OUT is pre-charged low; whereas, when the input is high, the output is high (with the feedback loop 30 being in the OFF state). So, when the CLKS is high, the output will follow the input.

More specifically, at the initial stage of operation, the clock CLKHN and clock CLKS are low (and CLKH is high as inverted from clock CLKHN). The low signals of the clock CLKHN and clock CLKS will result in the input INP being low. In this initial stage, the PMOS transistors T1 and T2 are turned ON (e.g., high), and the output OUTN will turn ON the PMOS transistor T6 of the keeper device 20. In this way, the keeper device 30 will be held in an ON state and the output OUT will be pre-charged to low. It should be noted that the operation of the transistor T5 is dependent on the input INP. For example, when INP is low, the transistor T5 will be ON; whereas, when INP is high, the transistor T5 will be turned OFF (e.g., resulting in the keeper device 20 being OFF). Also, when the CLKH is high the feedback loop 30 will be turned OFF, e.g., transistors T7 and T10 are turned OFF.

Still referring to FIGS. 1 and 2, when the clock CLKS is high, e.g., INP is high, the transistor T1 is turned OFF and the NMOS transistors T3 and T4 are turned ON. In turn, the output OUTN will be low and the output OUT will be high. In this operational stage, the PMOS transistor T5 is turned OFF, resulting in the keeper device 20 being OFF. It should also be recognized that nothing is holding when the transistor T1 is turned OFF. Also, it should be now be understood that when the clock CLKS is high, both the PMOS and NMOS devices (e.g., transistors T7-T10) are turned OFF. And, in the evaluating mode, the keeper device 30 will hold the value of OUTN high. In embodiments, the pre-charge path is slower than the evaluate path.

Figure 3:
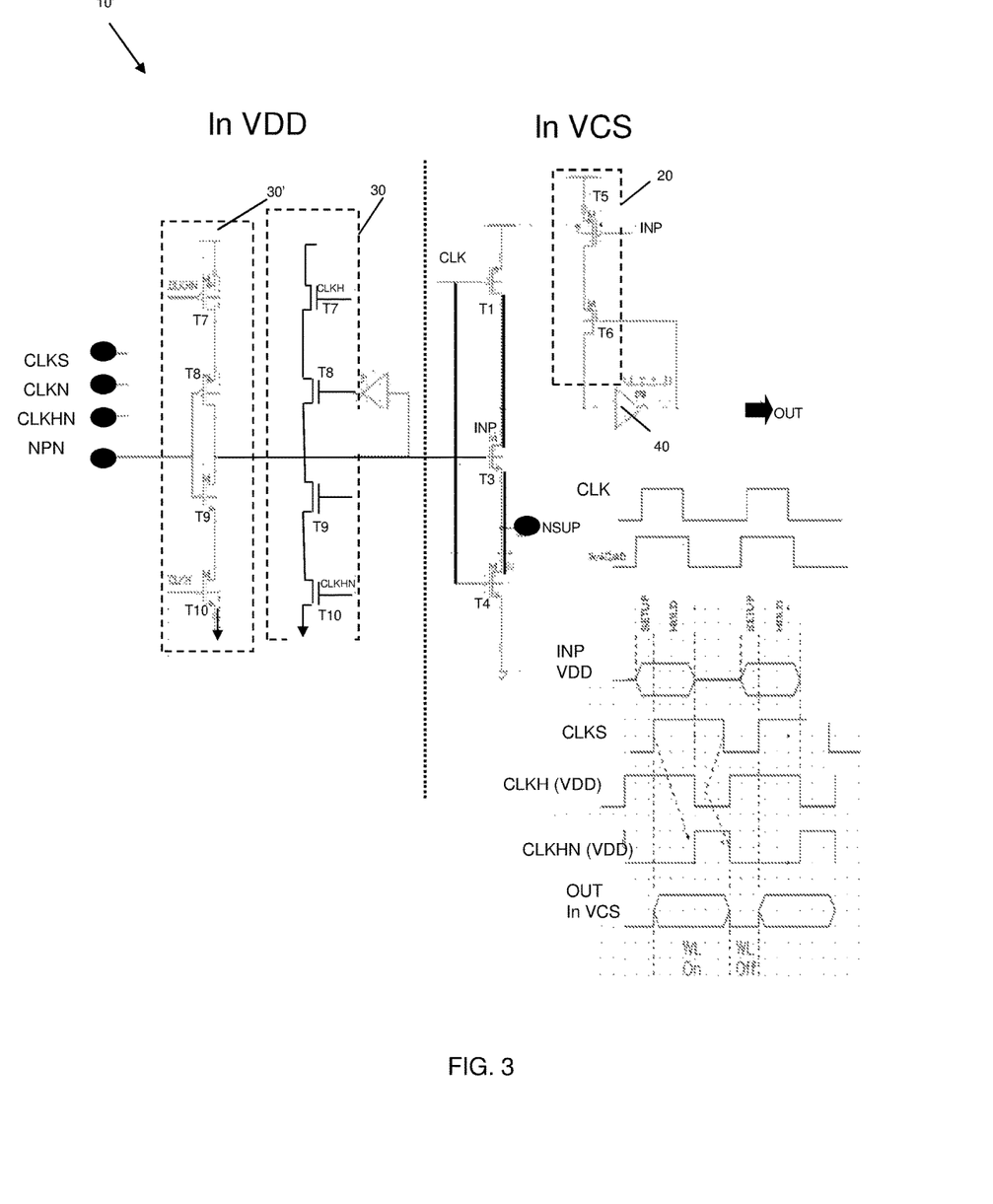
FIG. 3 shows an integrated level translator and latch circuit and accompanying timing diagram in accordance with additional aspects of the present disclosure.

FIG. 3 shows an integrated level translator and latch circuit and accompanying timing diagram in accordance with additional aspects of the present disclosure. In the embodiment of FIG. 3, the integrated level translator and latch circuit 10' includes feedback loop 30 and forward path 30', while eliminating the need for the NOR gate 50 shown in FIG. 1. As shown, the each of the feedback loop 30 and forward path 30' include transistors T7-T10 in a series arrangement. In addition, the PMOS transistor T3 shown in FIG. 1 can be eliminated due to the fact that the clock signal of clock CLKHN will be fed through the feedback loop 30 and forward path 30'. Also, the clocks CLKH and CLKHN are in the VDD domain.

In operation of the circuit 10', for example, when the clock CLKH is high and the clock CLKHN is low, the output OUTN will drive the input INP. Also, when the clock CLKH is low and the clock CLKHN is high, the feedback loop 30 and forward path 30' will be turned ON. Also, although the integrated level translator and latch circuit 10' is functionally equivalent to the circuit 10 of FIG. 1, it should be recognized that the circuit 10' of FIG. 3 has less loading on all the three clocks.

Figure 4:
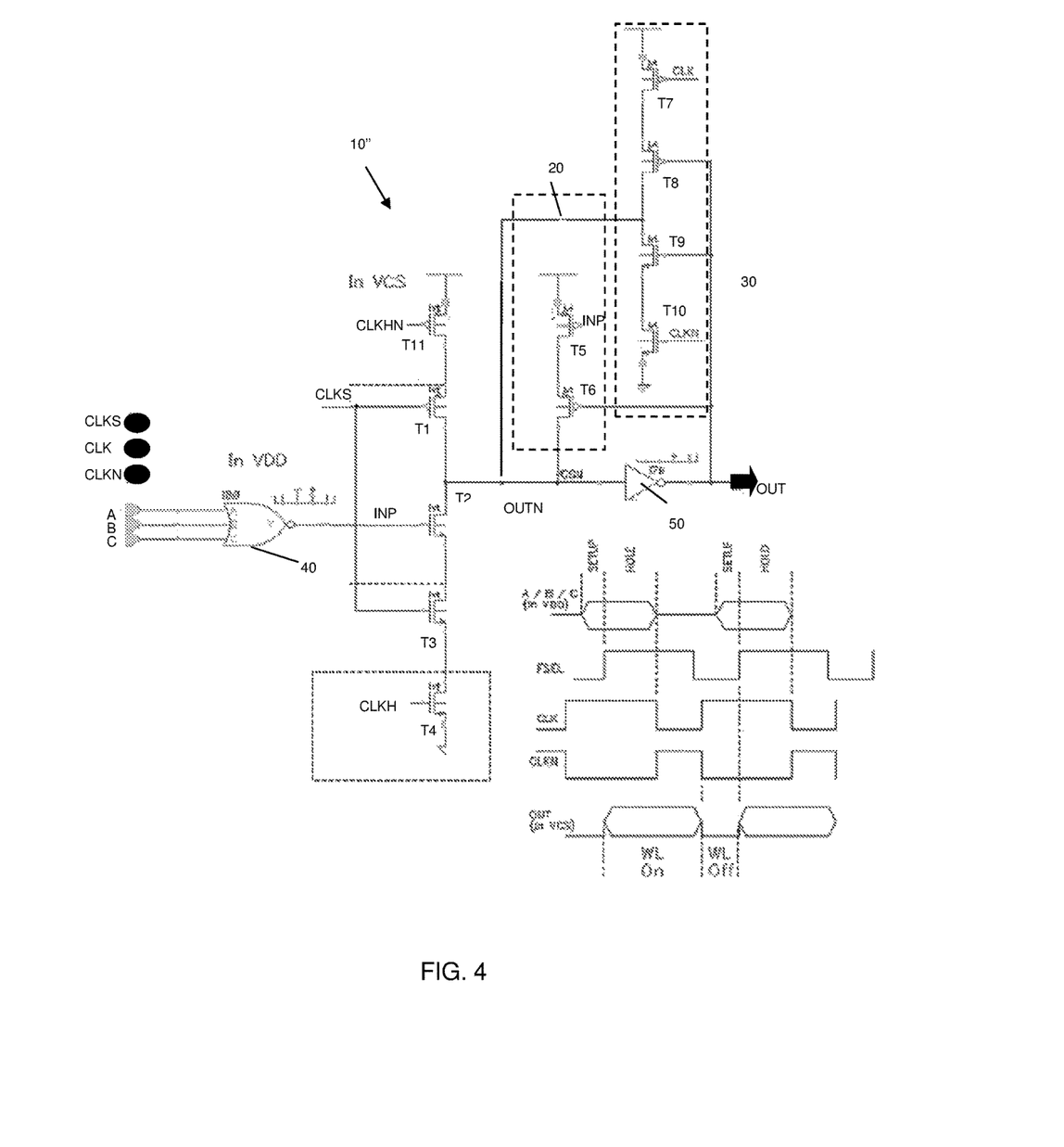
FIG. 4 shows an integrated level translator and latch circuit and accompanying timing diagram in accordance with additional aspects of the present disclosure.

FIG. 4 shows an integrated level translator and latch circuit and accompanying timing diagram in accordance with additional aspects of the present disclosure. In FIG. 4, the integrated level translator and latch circuit 10" includes a forward path with five transistors (e.g., T1-T4 and T11), with the remaining portion of circuit 10" similar to that shown in FIG. 1. In embodiments, transistor T11 is in the VCS domain which can be shared across four blocks to minimize clock loading. In addition, transistors T3 and T4 can also be shared across four blocks to minimize clock loading. In this embodiment, the input of the transistor T11 is a signal from clock CLKHN and the input of the transistor T11 is a signal from clock CLKH.

In operation, when the CLKS is high, the integrated level translator and latch circuit 10" will be in the evaluate mode. Also, in the initial operational stage, when the clock CLKH is high and the clock CLKHN is low, the transistors T1 and T5 are turned ON, the transistor T4 is OFF and the initial output OUTN is pre-charged high. In embodiments, the transistor T2 may or may not be turned ON, depending on the inputs A, B, C. In turn, the output OUT is low. Also, when the CLKS is low, the output OUT is pre-charged to low; whereas, when the clock CLKS is high, the output OUT is equal to INP. On the other hand, when the clock CLKH is low and clock CLKHN is high, the feedback loop 20 will be ON, which will hold the state of the output OUT.

In embodiments, the inputs A, B, C are WL address in VDD domain and the clock CLKS is the pre-charge/evaluation clock in the VCS domain. Also, as previously noted, the clocks CLK/CLKN are derived from CLKS (e.g., rising edge pulse stretched CLKS is CLKN of approximately 6 gates pulse stretch delay). Additionally, the clocks CLK/CLKN are the latch clocks. Similar to that already described, setup time is in relation to the CLKS rising edge and the hold is in relation to the CLKN rising edge. Moreover, in order to reduce loading on CLKS, CLK and CLKN, the boxed legs are shared across four such latches.

The circuit of the present disclosure can be manufactured in a number of ways using a number of different tools. In general, though, the methodologies and tools are used to form structures with dimensions in the micrometer and nanometer scale. The methodologies, i.e., technologies, employed to manufacture the circuit of the present disclosure have been adopted from integrated circuit (IC) technology. For example, the structures are built on wafers and are realized in films of material patterned by photolithographic processes on the top of a wafer. In particular, the fabrication of the circuit uses three basic building blocks: (i) deposition of thin films of material on a substrate, (ii) applying a patterned mask on top of the films by photolithographic imaging, and (iii) etching the films selectively to the mask.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising an integrated level translator and latch for wordline decoders comprising a first clock (CLKS) and a second clock (CLKH), the first clock (CLKS) being used as a precharge and evaluation clock with its timing being critical for forward edge and the second clock (CLKH) being a latch clock, and a feedback loop comprising transistors in a series configuration and a keeper device comprising transistors in a series configuration, wherein one of the transistors of the keeper device is independently controlled by an input (INP) and another of transistor of the keeper device is controlled by an output (OUTN) of the integrated level translator and latch, wherein when the first clock (CLKS) is high, an output (OUT) of the integrated level translator and latch is equal to the input (INP) and when the first clock (CLKS) is low, the output (OUT) is pre-charged to low.

2. The structure of claim 1, wherein the first clock (CLKS) is in VCS domain.

3. The structure of claim 1, wherein the input (INP) is part of VDD domain.

4. The structure of claim 1, further comprising a third clock (CLKHN) which is an inverted clock of the second clock (CLKN).

5. The structure of claim 4, wherein both the second clock (CLKN) and the third clock (CLKHN) are latch clocks.

6. The structure of claim 4, wherein the second clock (CLKN) and the third clock (CLKHN) are derived from the first clock (CLKS).

7. The structure of claim 4, wherein the first clock (CLKS), the second clock (CLKN) and the third clock (CLKHN) are shared across latches.

8. The structure of claim 4, wherein setup time is in relation to a rising edge of the first clock (CLKS) and hold is in relation to a rising edge of the third clock (CLKHN).

9. An integrated level translator and latch for input signals comprising:
a first clock (CLKS) in VCS domain and which is configured as a precharge and evaluation clock with its timing being critical for forward edge;
a second clock (CLKH) derived from the first clock (CLKS);
a third clock (CLKHN) which is inverse to the second clock (CLKN), the second clock (CLKN) and the third clock (CLKHN) being latch clocks; and
a keeper device comprising a plurality of transistors in series,
wherein a first transistor of the keeper device is independently controlled by an input (INP) and a second transistor of the keeper device is controlled by an output (OUTN) of a level translator.

10. The integrated level translator and latch of claim 9, wherein the second clock (CLKH) is in VDD domain.

11. The integrated level translator and latch of claim 9, wherein when the first clock (CLKS) is high, output (OUT) of the integrated level translator and latch is equal to the input (INP) and when the first clock (CLKS) is low, the output (OUT) is pre-charged to low.

12. The integrated level translator and latch of claim 9, wherein the input (INP) is part of VDD domain.

13. The integrated level translator and latch of claim 9, further comprising a feedback loop comprising transistors in a series configuration.

14. The integrated level translator and latch of claim 9, wherein the first clock (CLKS), the second clock (CLKN) and the third clock (CLKHN) are shared across latches.

15. The integrated level translator and latch of claim 9, wherein setup time is in relation to a rising edge of the first clock (CLKS) and hold is in relation to a rising edge of the third clock (CLKHN).

16. A method comprising:
at the initial stage of operation, setting a first clock (CLKHN) and a second clock (CLKS) to low and a third clock (CLKH) to high, wherein the low signals of the first clock (CLKHN) and the second clock (CLKS) result in an input (INP) going low; and
feeding the low of the input (INP) to holding a keeper device which holds the keeper device in an ON state so that an output (OUT) will be pre-charged to low, wherein:
when the third clock (CLKH) is set high, a feedback loop will be turned OFF; and
when the second clock (CLKS) is set high, the input (INP) goes high based on inputs of a wordline address, the output (OUT) will be high and the keeper device will be turned OFF.

17. The method of claim 16, wherein:
when the third clock (CLKH) is high and the first clock (CLKHN) is low, an output (OUTN) of a level translator will drive the input (INP);
when the third clock (CLKH) is low and the first clock (CLKHN) is high, a feedback loop and forward path will be turned ON which will hold a state of the output (OUT); and
when the second clock (CLKS) is high, the level translator will be in an evaluate mode.

* * * * *

UNITED STATES PATENT AND TRADEMARK OFFICE
CERTIFICATE OF CORRECTION

PATENT NO. : 10,020,809 B2
APPLICATION NO. : 15/269139
DATED : July 10, 2018
INVENTOR(S) : Venkatraghavan Bringivijayaraghavan Page 1 of 1

It is certified that error appears in the above-identified patent and that said Letters Patent is hereby corrected as shown below:

In the Claims

In Claim 10, Line 34 at Column 6, change "CLKN" to "CLKH".

In Claim 16, Line 58 at Column 6, delete "holding".

Signed and Sealed this
Sixth Day of November, 2018

Andrei Iancu
*Director of the United States Patent and Trademark Office*